(12) United States Patent
Lerner et al.

(10) Patent No.: US 6,464,799 B1
(45) Date of Patent: Oct. 15, 2002

(54) METHOD FOR MANAGING A FLUID LEVEL ASSOCIATED WITH A SUBSTRATE PROCESSING TANK

(75) Inventors: Alexander Lerner, San Jose; Brian J. Brown, Palo Alto; Boris Fishkin, San Carlos; Jonathan S. Frankel, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 09/580,881

(22) Filed: May 30, 2000

Related U.S. Application Data
(60) Provisional application No. 60/136,911, filed on Jun. 1, 1999.

(51) Int. Cl.[7] .............................. B08B 3/10; B08B 7/04
(52) U.S. Cl. .......................... 134/18; 134/10; 134/19; 134/34; 134/35; 134/36; 134/111
(58) Field of Search .............................. 134/10, 18, 19, 134/34, 35, 36, 111

(56) References Cited

U.S. PATENT DOCUMENTS

| | | | |
|---|---|---|---|
| 4,819,483 A | * | 4/1989 | Emplit et al. ............. 73/304 C |
| 5,011,715 A | | 4/1991 | Broadbent |
| 5,370,743 A | | 12/1994 | Usui et al. |
| 6,050,283 A | | 4/2000 | Hoffman et al. |

* cited by examiner

*Primary Examiner*—Zeinab El-Arini
(74) *Attorney, Agent, or Firm*—Dugan & Dugan

(57) ABSTRACT

An improved method and apparatus for adjusting chemistry concentrations and temperatures within a substrate processing tank is provided. A first aspect may include checking the fluid level within the tank, and, if the level is higher than a predetermined upper level, bleeding an amount of fluid from the tank; if the level is lower than a predetermined lower level, flowing an amount of fluid to the tank, and if the level is between the predetermined upper and lower levels, bleeding an amount of fluid from the tank and flowing an amount of fluid to the tank. A second aspect may include flowing water into the tank at a flow rate at least equivalent to the flow rate of water required to achieve a chemistry spike of a predetermined concentration and volume prior to beginning the flow of chemicals. A third aspect may include a method and apparatus for heating or cooling chemistry to a predetermined temperature as the chemistry is recirculated.

29 Claims, 4 Drawing Sheets

METHOD FOR MANAGING A FLUID LEVEL ASSOCIATED WITH A SUBSTRATE PROCESSING TANK

This application claims priority from U.S. provisional application Ser. No. 60/136,911, filed Jun. 1, 1999.

FIELD OF THE INVENTION

The present invention relates to a method and apparatus for promoting uniform processing within a substrate processing tank. More specifically, the present invention relates to a method and apparatus for controlling fluid temperatures and chemical concentrations within a tank used for semiconductor processing, such as a megasonic tank.

BACKGROUND OF THE INVENTION

In the field of semiconductor processing, it is important to ensure that each processed wafer (e.g., patterned, or unpatterned, etc.) experiences identical processing conditions so as to ensure consistent quality. Bath-type processes present particular process uniformity issues. Evaporation, chemistry decomposition and process temperature each vary over time. For example, conventional megasonic tank-type cleaners submerge a wafer in a tank of cleaning chemistry, typically comprising a mixture of deionized water, ammonia and hydrogen peroxide. To achieve desired cleaning performance, the concentration of each component is carefully controlled as the tank is filled with chemistry. However, as ammonia quickly evaporates, and hydrogen peroxide readily decomposes (forming water and oxygen) the concentration of each component immediately begins to change.

Further, the chemistry is heated to a desired temperature as the chemistry flows into the tank. To achieve desired cleaning performance and ensure consistent quality wafers, the chemistry is maintained within a close tolerance of the desired temperature. However, during processing, the heat generated by the transducers which megasonically energize the chemistry also undesirably heat the chemistry. This undesirable heating of the chemistry not only causes processing variations, but also further accelerates the rate of chemical evaporation and decomposition.

To combat the process drift described above, test wafers are periodically processed in a megasonic tank, and the chemical concentration of the bath is adjusted based on the cleanliness of the test wafers. This method is labor intensive and subject to human error. Moreover, system productivity is decreased by the need to run test wafers. Alternative methods continuously bleed chemistry from the tank while feeding fresh chemistry to the tank. These methods require huge energy consumption to heat the continuous volume of chemistry flowing to the tank.

Accordingly, a need exists for an improved method and apparatus for controlling temperature and concentration of chemistries within a substrate processing tank such as a megasonic tank.

SUMMARY OF THE INVENTION

The present invention provides an improved method and apparatus for adjusting chemistry concentrations and temperatures within a substrate processing tank. In a first aspect the inventive method comprises checking the fluid level within the tank, and, if the level is higher than a predetermined upper level, bleeding an amount of fluid from the tank; if the level is lower than a predetermined lower level, flowing an amount of fluid to the tank, and if the level is between the predetermined upper and lower levels, bleeding an amount of fluid from the tank and flowing an amount of fluid to the tank.

In a second aspect, the inventive method comprises flowing water into the tank at a flow rate at least equivalent to the flow rate of water required to achieve a chemistry spike of a predetermined concentration and volume (e.g., 50 ml/minute water for a 210 ml/minute flow rate of 5 parts water and 2 parts chemical), prior to beginning the flow of chemicals.

In a third aspect, the invention provides a method and apparatus for heating or cooling chemistry to a predetermined temperature as the chemistry is recirculated.

Each aspect of the invention may be automated, in the form of a program product, and therefore may reduce the labor costs associated with many conventional methods. Each aspect also may exhibit its own advantages, for instance the first aspect of the invention may conserve both energy and chemistry, as chemistry is only periodically flowed into the tank, requiring less chemistry and less energy to heat and pump the chemistry. The second aspect may prevent harmful concentrations of chemistry from being released, and the third aspect may reduce evaporation and decomposition rates. Each aspect of the invention may reduce process drift, increase processing uniformity and the uniform quality of wafers processed thereby.

Other features and advantages of the present invention will become more fully apparent from the following detailed description of the preferred embodiments, the appended claims and the accompanying drawings.

DETAILED DESCRIPTION OF THE DRAWINGS

Figure 1:
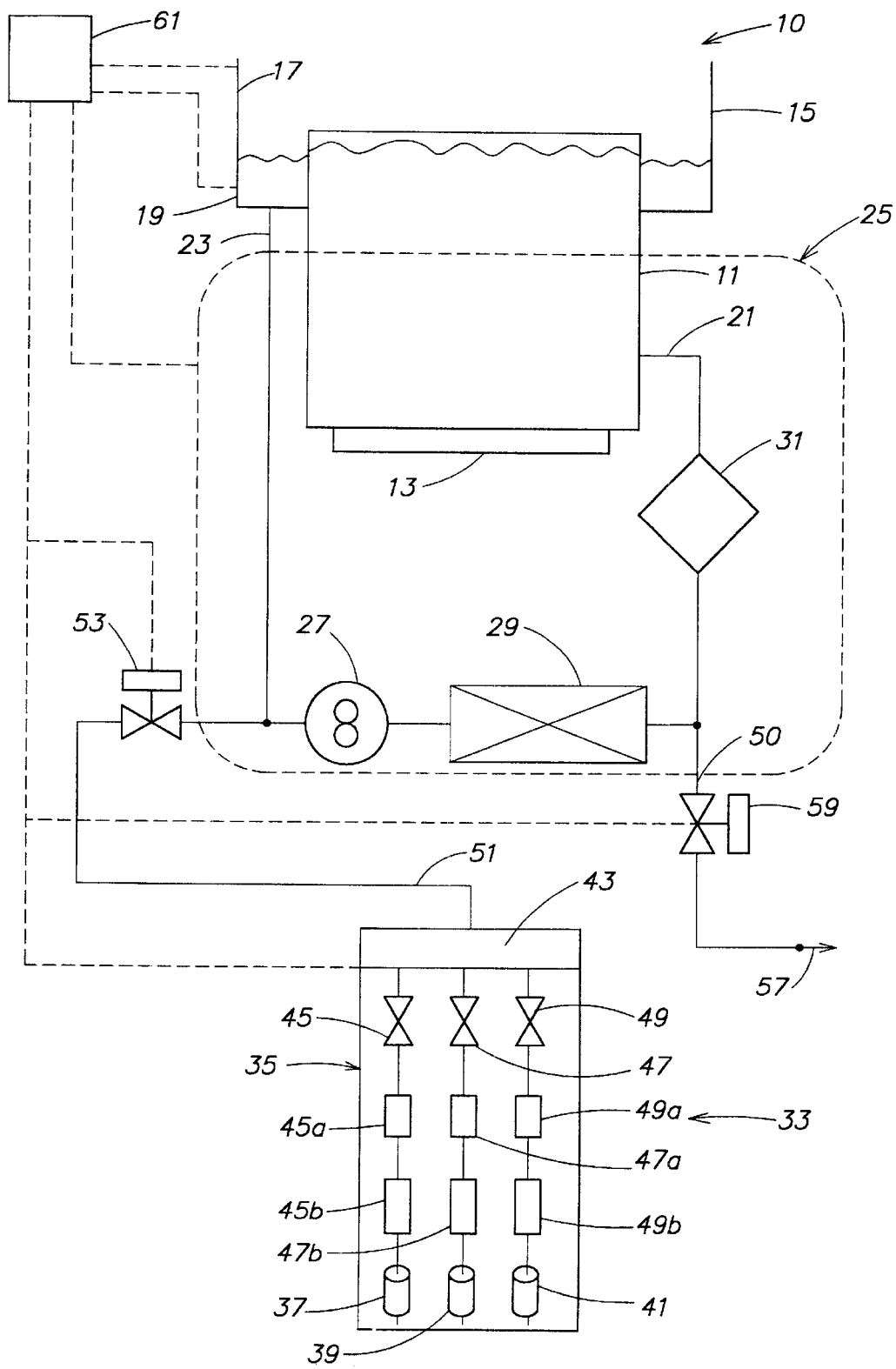
FIG. 1 is a schematic side elevational view of the inventive apparatus for fluid control within a substrate processing tank.

FIG. 1 is a schematic side elevational view of an inventive fluid flow system 10 for controlling fluid within a tank-type substrate processing system, such as an exemplary megasonic tank 11 having a transducer 13 coupled thereto so as to transmit sonic energy to fluid contained within the tank 11. Also coupled to the tank 11 are an overflow weir 15 having a high fluid level detector 17 and a low fluid level detector 19, a fluid inlet 21 (coupled to the tank 11) and a fluid outlet 23 (coupled to the overflow weir 15). Coupled between the fluid inlet 21 and the fluid outlet 23 is a fluid recirculation loop 25. The fluid recirculation loop 25 comprises a pump 27, a temperature controller 29 and a filter 31, such that fluid is pumped from the fluid outlet 23 through the pump 27, the temperature controller 29 and the filter 31 prior to returning to the tank 11 via the fluid inlet 21. Coupled to the fluid recirculation loop 25 is a fluid level/concentration system 33 comprising a liquid delivery module 35 comprising, for example, a source of deionized water 37, a source of ammonia 39 and a source of hydrogen peroxide 41. Each of the fluid sources 37, 39 and 41 is coupled to a mixing chamber 43 via a valve 45, 47 and 49, respectively. An outlet line 51 of the mixing chamber 43 couples a valve 53 prior to coupling to the fluid recirculation loop 25 between the fluid outlet 23 of the overflow weir 15 and the pump 27. The fluid flow system 10 also comprises a drain line 50 which is coupled to the fluid recirculation loop 25 between the temperature controller 29 and the filter 31. The drain line 50 is coupled to a drain 57 via a restrictor 59.

A controller 61 operatively couples to the transducer 13, the pump 27 and the temperature controller 29. Also, the controller 61 couples to the high fluid level detector 17, the low fluid level detector 19, the valves 45, 47 and 49, and the valve 53. A program which may be stored within the controller 61, or may be read by the controller 61 from a carrier such as a floppy disc, or an electronic signal from a remote location (e.g., a computer networked to the controller 61 locally or via an intra or internet, etc.) controls the operation of the inventive fluid flow system 10. The program which controls performance of the inventive method is described further with reference to FIGS. 2–3.

In operation, assuming an exemplary chemistry recirculation rate of 210 ml/minute and assuming a safe maximum chemical concentration spike of five parts deionized water, one part ammonia and one part hydrogen peroxide (i.e., a 5-1-1 concentration), the valve 45 is manually set for a minimum flow rate of at least 150 ml/minute, and the valves 47 and 49 are each manually set for a maximum flow rate of 30 ml/minute, and the valve 53 is set for a maximum flow rate of 210 ml/minute. For example, the valves 45, 47 and 49 may be provided with factory preset flow switches which set a minimum flow rate (e.g., a flow switch 45a which sets a minimum flow rate of 150 ml/min for deionized water flow control valve 45) or a maximum flow rate (e.g., a flow switch 47a and a flow switch 49a which set a maximum flow rate of 30 mL/min for ammonia and hydrogen peroxide flow control valves 47, 49, respectively). The flow switches may be hard-interlocked to the chemical valves 45, 47 and 49. Tripping any of the flow switches will shut down the liquid delivery module 35. Additionally there may be manual flow controllers 45b–49b (e.g., manual flow meters) which manually control the flow rates to the valves 45–49, respectively. For example, the flow controllers 45b–49b may be manually set to allow any mixing ratio of the deionized water, ammonia and hydrogen peroxide within safety limits (e.g., 200 mL/min for deionized water valve 45b, 20 mL/min for ammonia valve 47b and 20 mL/min for hydrogen peroxide 49b). Thereafter, the tank 11 is filled with a desired chemical concentration, for example, six parts deionized water, one part ammonia, and one part hydrogen peroxide (i.e., a 6-1-1 concentration). In this example the spike is set to be of higher concentration than the chemistry contained in the tank, so as to compensate for decomposition. However, if decomposition does not occur and only fluid level varies, the spike would be set to the same concentration as the fluid within the tank 11.

As particles are cleaned from a wafer, they tend to collect on the surface of the chemistry bath. To prevent such particles from re-adhering to a wafer as the wafer is lifted from the bath, fluid is continuously flowed into the tank 11 via the fluid inlet 21 at a constant rate (e.g., 10 ml/minute), causing the fluid and the particles floating thereon to overflow into the overflow weir 15. Accordingly, if no processing variables existed, the fluid level in the overflow weir 15 would maintain a constant level. However, due to evaporation and due to the fact that a certain amount of fluid adheres to the surface of each wafer as the wafer is removed from the tank, the fluid level in the overflow weir 15 varies. Detection of a low level indicates that fluid and particles are not being sufficiently flushed into the overflow weir 15, and, depending on the particular chemistry may indicate rapid evaporation. Detection of a high level indicates that evaporation and probably decomposition (which often occurs when evaporation occurs) if the chemistry is known to decompose, is occurring. Accordingly, to combat the problems of insufficient flush rate and chemistry concentration variation, the controller 61 is programmed to periodically check the high fluid level detector 17 and the low fluid level detector 19 to determine whether the fluid level in the overflow weir 15 is above, below or within the desired range (e.g., between the high fluid level detector 17 and the low fluid level detector 19 and to spike and/or drain chemistry to and from the tank 11 to correct concentration variations and flush rates, as best understood with reference to FIG. 2.

The description of FIGS. 2–3 will assume the exemplary process conditions described below. Assume that the tank 11 has been filled with a 6-1-1 concentration of deionized water, ammonia and hydrogen peroxide, respectively, which is heated to 65° C. as it flows through the temperature controller 29. Because ammonia and hydrogen peroxide are known to readily evaporate and decompose, respectively, in this example a 30 sec, 100 cc/minute chemistry spike of 5-1-1 concentration of deionized water, ammonia and hydrogen peroxide, respectively, is periodically desired. The volume and concentration of the spike, and the desired frequency of the spike is determined based on test results for the specific process (e.g., chemistry, temperature, tank configuration, acoustic energy levels, process time, wafer size, etc.), as will be readily determinable by workers of ordinary skill in the art. To adequately flush particles from the overflow weir 15, the pump 27 continuously pumps fluid from the overflow weir 15, through the temperature controller 29 and the filter 31 and back into the tank 11 via the fluid inlet 21 at a rate of 10 l/minute. The various aspects of the invention will be described with reference to FIGS. 2–3 with reference to the exemplary process conditions provided above.

Figure 2:
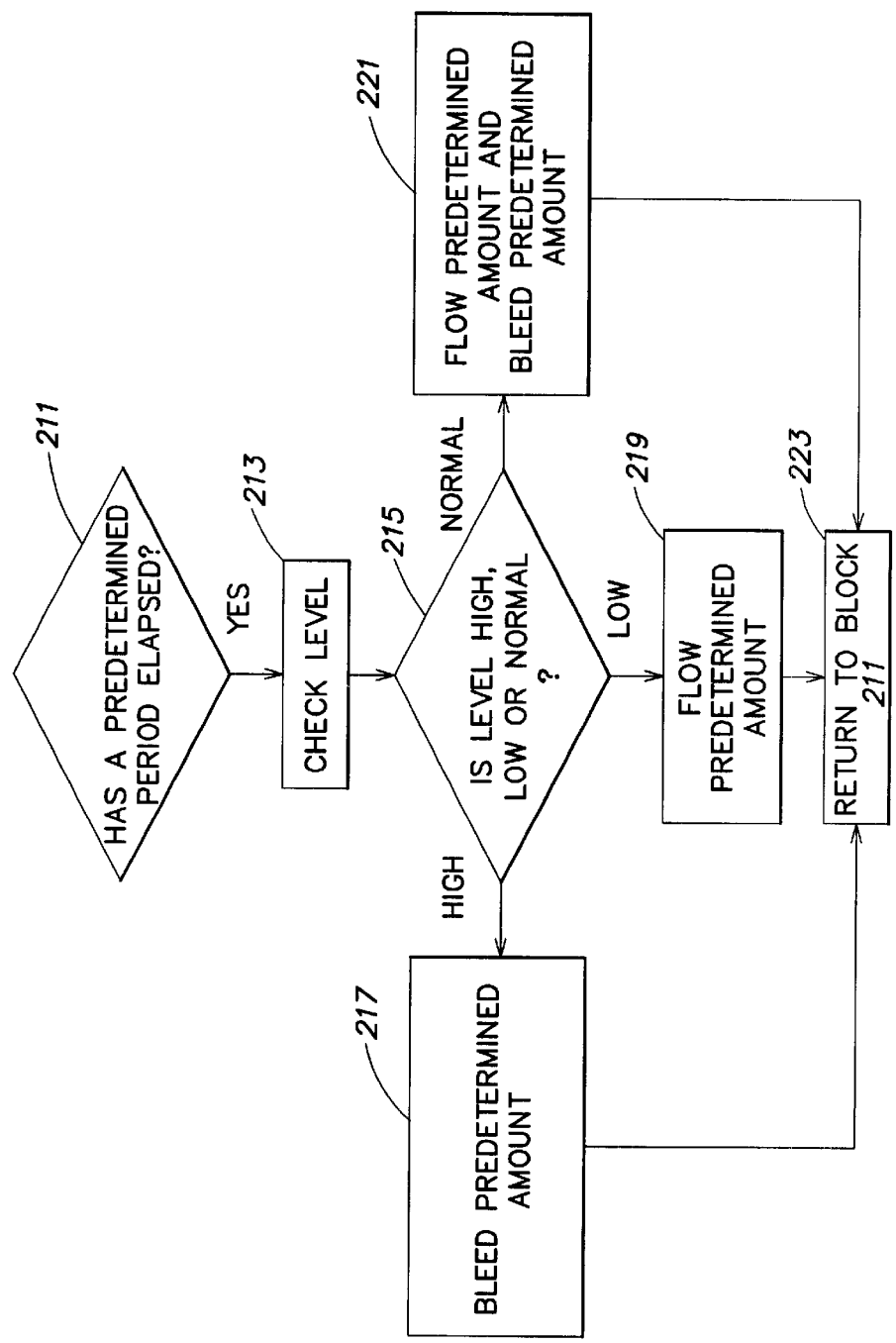
FIG. 2 is a flow chart useful for describing a first aspect of the invention.

FIG. 2 is a flow diagram useful for describing a first aspect of the inventive fluid control system. In block 211 the controller 61 checks to see whether a predetermined period has elapsed (e.g., whether a predetermined period of time has elapsed and/or a predetermined number of wafers have been cleaned). If the predetermined period has elapsed, the controller checks the fluid level within the overflow weir 15 (block 213), and determines whether the level is high, low or normal based on readings from the high fluid level detector 17 and the low fluid level detector 19 (block 215).

Thereafter, if the fluid level in the overflow weir 15 is high, the controller 61 causes the valve 59 to open to an extent, and for a period of time sufficient to bleed a predetermined amount of fluid from the tank 11 (block 217). Preferably the amount of fluid bled from the tank 11 is equal to the amount of fluid supplied to the tank 11 during a spike, in this example 100 cc/minute for 30 seconds. If the fluid level in the overflow weir 15 is low, the controller 61 causes the valve 53 to open to an extent, and for a period of time sufficient to spike a predetermined amount of chemistry (in this example 100 cc/minute for 30 seconds) to the tank 11 (block 219). If the fluid level in the overflow weir 15 is normal (e.g., between the high fluid level detector 17 and the low fluid level detector 19) the controller 61 causes the restrictor 59 to open so as to bleed a predetermined amount of fluid (in this example 100 cc/minute for 30 seconds) from the tank 11, while simultaneously causing the valve 53 to open so as to spike a predetermined amount of chemistry (in this example 100 cc/minute for 30 seconds) to the tank 11 (block 221). After the predetermined amount of fluid is flowed to and/or bled from the tank 11 (blocks 217, 219 and 221), the controller program proceeds to block 223 which returns to block 211 to again determine or monitor whether a predetermined period has elapsed. The specific method for safely flowing the predetermined amount of chemistry to the tank 11 is described in detail with reference to FIG. 3.

Figure 3A:
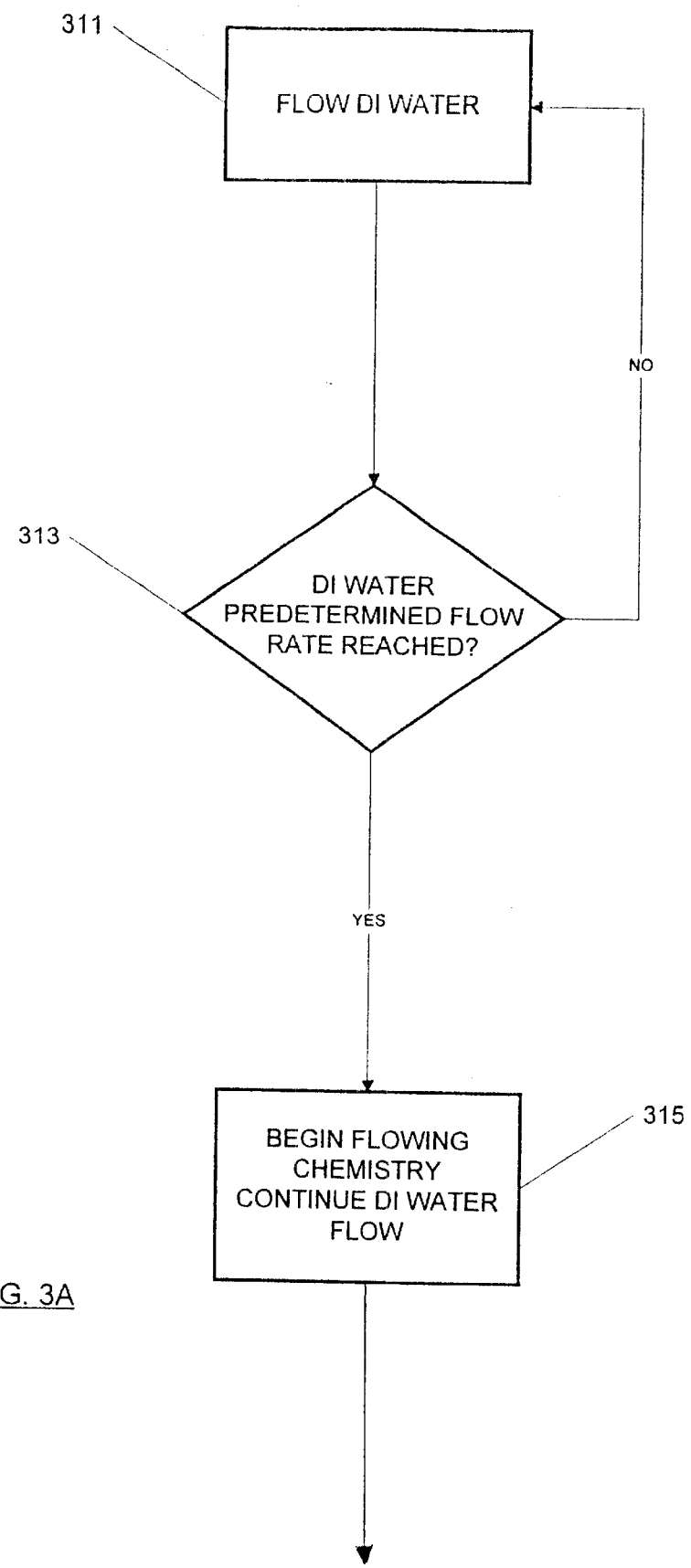
FIG. 3 is a flow chart useful for describing a second aspect of the invention.
Figure 3B:
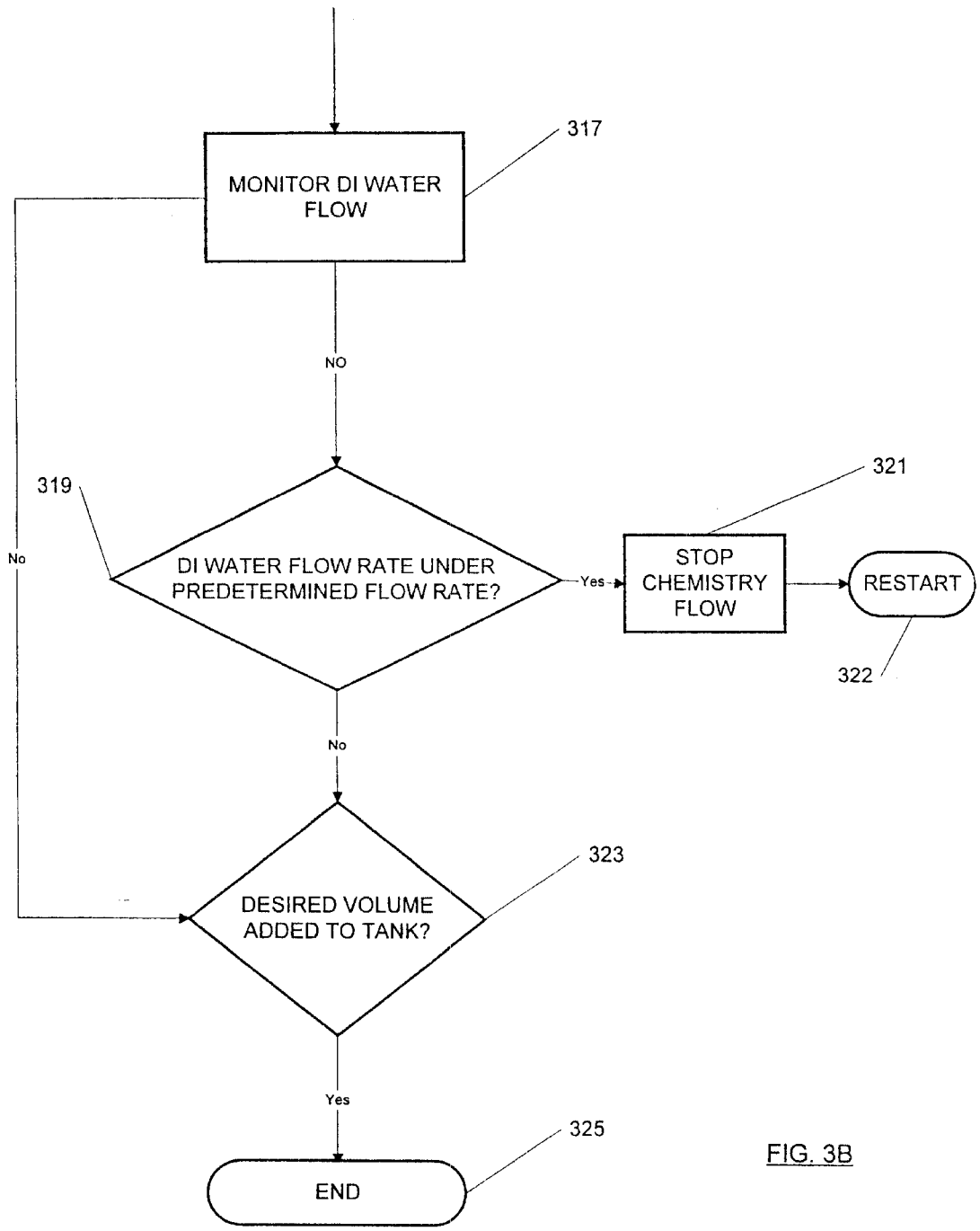

FIG. 3 is a flow diagram useful for describing a second aspect of the invention which ensures safe chemistry concentrations are spiked to the tank 11. Accordingly, FIG. 3 describes a plurality of program steps that are preferably performed as part of blocks 219 and 221 of FIG. 2.

After the controller 61 determines that a spike is needed (as described with reference to block 215 of FIG. 2) the controller 61 causes the source of deionized water 37 to open to an extent sufficient to allow a flow rate equivalent to the flow rate of deionized water required to achieve a predetermined concentration and volume of chemistry to be flowed to the liquid delivery module 35 (block 311). In this example for a desired 100 cc/minute flow rate of a 5-1-1 concentration the source of deionized water 37 opens so as to flow 50 cc/minute of deionized water. Thereafter, the controller 61 monitors the flow rate of deionized water through the source of deionized water 37 to determine when the flow rate reaches 50 cc/minute (block 313). As soon as a 50 cc/minute flow rate of deionized water is flowing through the source of deionized water 37 the controller 61 opens the source of ammonia 39 and the source of hydrogen peroxide 41 to an extent such that 10 cc/minute can flow through each valve 47, 49 (block 315). In this manner, by ensuring that the desired flow rate of deionized water is reached prior to flowing any chemistry, the inventive fluid control system is programmed to ensure that the concentration level of chemistry does not exceed the 5-1-1 desired concentration. Therefore, the substrate is not subjected to pockets of higher concentration chemistry which may cause non-uniform cleaning, or may etch or degrade the substrate's surface. Further, because the valves 47 and 49 which control the flow rate of ammonia and hydrogen peroxide, respectively, are manually set to 10 cc/minute (as previously desired) the hardware acts as a fail safe preventing more than 1 part of each chemistry from flowing to the tank 11. Accordingly, large quantities of chemistry are prevented from flowing, and the possibility of flammability, high levels of fumes, etc., is reduced.

The controller 61 continues to monitor the flow rate of at least the deionized water (block 317). If the deionized water flow rate drops below the predetermined rate (e.g., 50 cc/minute) (block 319) the controller 61 stops the chemistry flow (block 321) and may restart the chemistry flow program (block 322) (or may be programmed to restart only if less than a preset amount of fluid has flowed to the tank, etc.). Otherwise, if the deionized water flow rate is not below the predetermined 50 cc/minute, the controller 61 will continue the flow of chemistry to the tank 11 until the desired volume (e.g., 50 cc) has been added to the tank (block 323). After the desired volume (e.g., 50 cc) has been added to the tank 11, the controller 61 closes the valves 45, 47, 49 and 53, stopping the flow of chemistry to the tank 11 (block 325).

As the chemistry flows from the liquid delivery module 35 to the tank 11 it passes through the temperature controller 29 and is heated to a predetermined temperature (e.g., 65° C.). Preferably the temperature of the chemistry which is bled from the tank (as described with reference to blocks 217 and 221) also flows through temperature controller 29 and therefore aids in preheating the chemistry spike, and in making the concentration of the spike more uniform with the existing chemistry within the tank 11.

Further, the temperature controller 29 heats or cools the fluid flowing therethrough to a predetermined temperature or range of temperatures. Thus, if the transducer 13 has heated the tank fluid beyond the preset temperature or range of temperatures, the temperature controller 29 cools the recirculating fluid, reducing the rate of evaporation. By mixing the incoming chemistry spike with the recirculating fluid the recirculating fluid is cooled and the chemistry spike is heated, reducing the energy required by the temperature controller 29 to maintain the fluid flowing therethrough at the predetermined temperature.

The foregoing description discloses only the preferred embodiments of the invention, modifications of the above disclosed apparatus and method which fall within the scope of the invention will be readily apparent to those of ordinary skill in the art. For instance, although each aspect of the invention is preferably employed within a processing tank's fluid control system, each aspect of the invention can be used alone or in combination with any of the remaining aspects. For example, in simpler form, the invention may comprise an apparatus for selectively heating and cooling the recirculating fluid, with or without mixing recirculating fluid with incoming chemistry spikes; may comprise spiking and/or bleeding chemistry to and from the tank based on high and low level readings of fluid contained in the tank itself or in the weir, with or without the steps of ensuring desired deionized water flow prior to beginning chemistry flow, and with or without the hardware fail safe design.

Accordingly, while the present invention has been disclosed in connection with the preferred embodiments thereof, it should be understood that other embodiments may fall within the spirit and scope of the invention, as defined by the following claims.

The invention claimed is:

1. A method of controlling fluid flow to a substrate processing tank, comprising the steps of:
   checking a fluid level associated with the tank to determine whether the fluid level is one of (a) a high level, (b) a low level and (c) a normal level; and
   in response to a result of the checking step, bleeding an amount of fluid from the tank if the fluid level is determined to be a high level, flowing an amount of fluid to the tank if the fluid level is determined to be a low level, and both bleeding an amount of fluid from the tank and flowing an amount of fluid to the tank if the fluid level is determined to be a normal level.

2. The method of claim 1 wherein bleeding an amount of fluid from the tank comprises bleeding a predetermined amount of fluid, and flowing an amount of fluid to the tank comprises flowing a predetermined amount of fluid to the tank.

3. The method of claim 2 wherein the predetermined amount of bled fluid and the predetermined amount of flowed fluid are equal.

4. The method of claim 1 wherein the fluid flowed to the tank comprises a mixture of water and at least one chemical, the mixture having been premixed at a vessel separate from the tank.

5. The method of claim 1 wherein if the fluid level is determined to be a normal level, the bleeding an amount of fluid from the tank and flowing an amount of fluid to the tank comprises simultaneously bleeding a predetermined amount and flowing a predetermined amount of fluid to and from the tank.

6. The method of claim 5 wherein the predetermined amount of bled fluid and the predetermined amount of flowed fluid are equal.

7. The method of claim 6 wherein the fluid flowed to the tank comprises a premixed chemistry.

8. The method of claim 1 wherein checking the fluid level and performing one of bleeding, flowing or simultaneously bleeding and flowing is performed periodically.

9. The method of claim 1 further comprising mixing the fluid flowed to the tank with a fluid recirculated from the tank.

10. The method of claim 9 further comprising heating the mixed flowed and recirculated fluid flowed to the tank if the mixed flowed and recirculated fluid is cooler than a predetermined temperature, and cooling the mixed flowed and recirculated fluid flowed to the tank if the mixed flowed and recirculated fluid is warmer than the predetermined temperature.

11. The method of claim 9 further comprising heating the mixed flowed and recirculated fluid flowed to the tank if the mixed flowed and recirculated fluid is cooler than a predetermined first temperature, and cooling the mixed flowed and recirculated fluid flowed to the tank if the mixed flowed and recirculated fluid is warmer than a predetermined second temperature wherein the second temperature is higher than the first temperature.

12. The method of claim 1 further comprising heating the fluid flowed to the tank if the fluid flowed to the tank is cooler than a predetermined temperature, and cooling the fluid flowed to the tank if the fluid flowed to the tank is warmer than the predetermined temperature.

13. The method of claim 1 further comprising heating the fluid flowed to the tank if the fluid flowed to the tank is cooler than a predetermined first temperature, and cooling the fluid flowed to the tank if the fluid flowed to the tank is warmer than a predetermined second temperature wherein the second temperature is higher than the first temperature.

14. A method of reducing fluid temperature variations within a substrate processing tank, comprising:
   providing a substrate processing tank containing a fluid;
   draining a portion of the fluid from the tank;
   adjusting a temperature of the portion of the fluid that was drained by:
      heating the portion of the fluid that was drained if the portion of the fluid that was drained is cooler than a predetermined temperature, and cooling the portion of the fluid that was drained if the portion of the fluid that was drained is warmer than a predetermined temperature; and
      returning to the tank the portion of the fluid that was drained.

15. The method of claim 14 wherein adjusting a temperature of the portion of the fluid that was drained further comprises:
   providing a thermo electrical device adapted to sense a temperature gradient between the portion of the fluid that was drained and a predetermined temperature and to output a voltage proportional to the temperature gradient.

16. The method of claim 14 wherein heating the portion of the fluid that was drained comprises heating the portion of the fluid that was drained to a predetermined temperature and wherein cooling the portion of the fluid that was drained comprises cooling the portion of the fluid that was drained to the predetermined temperature.

17. The method of claim 14 wherein draining a portion of the fluid comprises periodically draining a predetermined volume of the fluid, adjusting the drained fluid's temperature and returning the drained fluid to the tank.

18. The method of claim 14 wherein draining a portion of the fluid comprises draining fluid, adjusting the fluid's temperature and returning the drained fluid to the tank in a continuous flow.

19. The method of claim 14 further comprising:
   combining the drained fluid with fresh fluid; and
      wherein adjusting the drained fluid's temperature comprises adjusting the temperature of the combined fluids by heating the combined fluids if the combined fluid is cooler than a predetermined temperature, and cooling the combined fluids if the combined fluid is warmer than a predetermined temperature.

20. The method of claim 19 wherein adjusting the drained fluid's temperature further comprises:
   providing a thermo electrical device adapted to sense a temperature gradient between the combined fluid and a predetermined temperature and to output a voltage proportional to the temperature gradient.

21. The method of claim 19 wherein heating the combined fluid comprises heating the combined fluid to a first temperature and wherein cooling the combined fluid comprises cooling the combined fluid to the first temperature.

22. The method of claim 19 wherein draining a portion of the fluid comprises periodically draining a predetermined volume of the fluid, adjusting the combined fluid's temperature and returning the combined fluid to the tank.

23. The method of claim 19 wherein draining a portion of the fluid comprises draining fluid and returning the drained fluid to the tank in a continuous flow.

24. A method of controlling fluid flow to a substrate processing tank, comprising:
   flowing deionized water;
   monitoring a flow rate of the deionized water to determine when the flow rate reaches at least a predetermined flow rate; and
   in response to a determination that the flow rate has reached at least the predetermined flow rate, beginning to flow at least one chemical to be mixed with the deionized water.

25. The method of claim 24 further comprising monitoring the flow of deionized water while flowing the at least one chemical; and
   stopping the at least one chemical from flowing if the deionized water flow rate falls below the predetermined flow rate.

26. The method of claim 24 wherein the at least one chemical is flowed through at least one valve, the at least one valve having a flow rate, the flow rate of the at least one valve being adjusted such that flowing the at least one chemical through the at least one valve produces a chemical concentration less than or equal to a predetermined maximum chemical concentration based on a predetermined deionized water flow rate.

27. A method of reducing fluid temperature variations within a substrate processing tank, comprising:
   providing a substrate processing tank containing a fluid;
   draining a portion of the fluid from the tank;
   cooling the portion of the fluid that was drained if the portion of the fluid that was drained is warmer than a predetermined temperature; and
   returning to the tank the portion of the fluid that was drained.

28. A method of reducing fluid temperature variations within a substrate processing tank, comprising:
   providing a substrate processing tank containing a fluid;
   draining a portion of the fluid from the tank;
   heating the portion of the fluid that was drained if the portion of the fluid that was drained is cooler than a predetermined temperature; and returning to the tank the portion of the fluid that was drained.

29. A method of controlling fluid flow to a substrate processing tank, comprising the steps of:

using a recirculation loop to recirculate a fluid from and to the tank;

checking a fluid level in an overflow weir associated with the tank to determine whether the fluid level is one of (a) a high level, (b) a low level and (c) a normal level;

in response to a result of the checking step, draining an amount of fluid from the recirculation loop if the fluid level is determined to be a high level, supplying an amount of fluid to the recirculation loop if the fluid level is determined to be a low level, and both draining an amount of fluid from the recirculation loop and supplying an amount of fluid to the recirculation loop if the fluid level is determined to be a normal level.

* * * * *